United States Patent
Kolluru (10) Patent No.: US 10,679,228 B2
(45) Date of Patent: Jun. 9, 2020

(54) SYSTEMS, DEVICES, AND METHODS FOR PREDICTING PRODUCT PERFORMANCE IN A RETAIL DISPLAY AREA

(71) Applicant: Walmart Apollo, LLC, Bentonville, AR (US)

(72) Inventor: Murthy Narayana Kolluru, Bentonville, AR (US)

(73) Assignee: Walmart Apollo, LLC, Bentonville, AR (US)

(*) Notice: Subject to any disclaimer, the term of this patent is extended or adjusted under 35 U.S.C. 154(b) by 835 days.

(21) Appl. No.: 15/085,260

(22) Filed: Mar. 30, 2016

(65) Prior Publication Data

US 2016/0292703 A1    Oct. 6, 2016

Related U.S. Application Data (60) Provisional application No. 62/140,244, filed on Mar. 30, 2015.

(51) Int. Cl.
| | |
|---|---|
| G06Q 10/00 | (2012.01) |
| G06Q 30/02 | (2012.01) |
| G06Q 10/06 | (2012.01) |
| G06F 30/00 | (2020.01) |
| G06F 30/20 | (2020.01) |

(52) U.S. Cl.
CPC ....... G06Q 30/0202 (2013.01); G06Q 10/067 (2013.01); *G06F 30/00* (2020.01); *G06F 30/20* (2020.01)

(58) Field of Classification Search
None
See application file for complete search history.

(56) References Cited

U.S. PATENT DOCUMENTS

| | | | |
|---|---|---|---|
| 7,734,495 B2 | 6/2010 | Klaubauf et al. | |
| 8,108,193 B2* | 1/2012 | Chu | G06Q 10/06 703/13 |
| 8,140,378 B2 | 3/2012 | Sorensen | |

(Continued)

OTHER PUBLICATIONS

Elbers, Tijmen, The effects of in-store layout- and shelf designs on cusotmer behavior, Jan. 23, 2016, https://edepot.wur.nl/369091, p. 1-23.*

(Continued)

*Primary Examiner* — Joseph M Waesco
(74) *Attorney, Agent, or Firm* — McCarter & English, LLP; David R. Burns (57) ABSTRACT

Provided herein are methodologies, systems, and devices for simulating the performance of products a within a display area of a retail store. Data relating to a product's attributes, location within a display area, and historical performance can be used to create a model that can predict the impact on sales that will result from moving particular items from one location in a display area to another location. Once created, this model can predict a product's performance at various locations and assist in optimizing product placement within a display area. A GUI of an electronic device can display a virtual display area that allows a user to create various product placement scenarios. The model may also display product placement recommendations based on the predicted performance values of various products at different locations within a display area.

20 Claims, 6 Drawing Sheets

(56) References Cited

U.S. PATENT DOCUMENTS

| | | | |
|---|---|---|---|
| 8,224,472 B1* | 7/2012 | Maluf | G06Q 10/06 700/97 |
| 8,412,656 B1 | 4/2013 | Baboo et al. | |
| 2005/0182647 A1* | 8/2005 | Saenz | G06Q 30/016 705/345 |
| 2007/0293958 A1* | 12/2007 | Stehle | G06Q 10/04 700/30 |
| 2008/0270363 A1* | 10/2008 | Hunt | G06F 16/2462 |
| 2008/0288889 A1* | 11/2008 | Hunt | G06Q 30/02 715/810 |
| 2010/0057415 A1* | 3/2010 | Chu | G06F 30/20 703/6 |
| 2010/0179885 A1* | 7/2010 | Fiorentino | G06Q 30/02 705/26.1 |
| 2011/0040636 A1* | 2/2011 | Simmons | G06Q 30/0249 705/14.71 |
| 2011/0261049 A1* | 10/2011 | Cardno | G06Q 10/10 345/419 |
| 2012/0035839 A1* | 2/2012 | Stehle | G06Q 10/04 701/117 |
| 2012/0323674 A1* | 12/2012 | Simmons | G06Q 30/02 705/14.41 |
| 2013/0339083 A1* | 12/2013 | Baier | G06Q 30/02 705/7.29 |
| 2014/0067467 A1* | 3/2014 | Rangarajan | G06Q 30/02 705/7.31 |
| 2014/0068448 A1* | 3/2014 | Plost | G06F 9/451 715/738 |
| 2014/0100769 A1* | 4/2014 | Wurman | B65G 1/10 701/301 |
| 2014/0278294 A1* | 9/2014 | Yeager | G06F 30/20 703/2 |
| 2014/0278771 A1* | 9/2014 | Rehman | G06F 16/24578 705/7.31 |
| 2014/0324537 A1* | 10/2014 | Gilbert | G06Q 10/06375 705/7.31 |
| 2014/0344186 A1* | 11/2014 | Nadler | G06Q 10/067 705/36 R |
| 2015/0199627 A1* | 7/2015 | Gould | G06Q 10/0631 705/7.12 |
| 2015/0302205 A1* | 10/2015 | Milman | G06F 21/60 726/26 |
| 2015/0304169 A1* | 10/2015 | Milman | G06F 21/60 709/220 |
| 2016/0005090 A1* | 1/2016 | Vollenweider | G06Q 10/06 705/26.4 |
| 2016/0063070 A1* | 3/2016 | Benum | G06F 3/04847 707/722 |
| 2016/0127010 A1* | 5/2016 | Rho | G06Q 50/20 375/257 |

OTHER PUBLICATIONS

International Search Report for Application No. PCT/US2016/024891, dated Jun. 20, 2016. 2 pages.

International Preliminary Report on Patentability for Application No. PCT/US2016/024891, dated Oct. 12, 2017. 7 pages.

Jajja, M.S.S. "Retail Shelf Space Allocation Analysis Using System Dynamics Approach," Journal of Quality and Technology Management, vol. XI, Issue I, pp. 99-129 (Jun. 2013).

Hubner, A.H. "Retail shelf space management model with space-elastic demand and consumer driven substitution effects," Pre-print of working paper submitted to SSRN, available at http://papers.ssrn.com/sol3/papers.cfm?abstract_id=1534665, dated Feb. 10, 2011.

* cited by examiner

SYSTEMS, DEVICES, AND METHODS FOR PREDICTING PRODUCT PERFORMANCE IN A RETAIL DISPLAY AREA

RELATED APPLICATIONS

This application claims priority to U.S. Provisional Patent Application Ser. No. 62/140,244 entitled "SYSTEMS, DEVICES, AND METHODS FOR PREDICTING PRODUCT PERFORMANCE IN A RETAIL DISPLAY AREA," filed on Mar. 30, 2015, the content of which is hereby incorporated by reference in its entirety.

TECHNICAL FIELD

The present disclosure relates to techniques for simulating the performance of products within a display area of a retail store. The present disclosure also relates to methodologies, systems and devices for calculating predicted performance values for products at specific locations within a display area.

BACKGROUND OF THE TECHNOLOGY

In general, product sales statistics may be calculated or gathered in a number of ways. Certain conventional techniques teach increasing product sales statistics by placing products at the eye level of customers, but do not provide a means for determining the specific impact on key performance metrics resulting from relocating a product within a retail display area.

SUMMARY

Exemplary embodiments of the present disclosure provide systems, devices and methods that facilitate product performance analysis based on various types of product data.

In accordance with exemplary embodiments, a method of simulating product performance based on physical and economic attributes associated with a product and a product display area in a retail location is disclosed. The method includes receiving, in an electronic computer-readable format, product attribute data corresponding to physical and economic attributes of a product, product location data representing a first physical location of the product within a display area of a store, and historical product performance data. The method also includes creating a model of the product at the first physical location based on the product attribute data and the historic data. The method also includes simulating product performance for the product using the model to generate a predicted performance value for the product at a second physical location within the display area of the store. The method also includes transmitting instructions to render the simulation of the product performance in a graphical user interface, and depicting within the graphical user interface, the predicted performance value.

In some embodiments, the method also includes writing the product attribute data, product location data, product performance data, and predicted performance value to a database. In some embodiments, the predicted performance value is representative of predicted sales, predicted units sold, or predicted profit margin of the product at a specific location within the display area. In some embodiments, the product attribute data is representative of product shelf volume, product price, product size, product weight, product shape, product shelf life, product brand, product seasonality, product marketing, product market share, or product brand contribution to category sales. In some embodiments, the historical product performance data is representative of sales, units sold, or profit margin for the product at each location within the display area. In some embodiments, the graphical user interface is also programmed to display a virtual display area including a graphical indicator of at least one product at a first location within the virtual display area. In some embodiments, the method also includes receiving, via the graphical user interface, user input relocating the at least one product from the first location to a second location within the virtual display area, and the graphical user interface is also programmed to display the at least one product at the second location within the virtual display area. In some embodiments, the user input includes a drag-and-drop command performed via a pointing device of the electronic display device. In some embodiments, the method also includes generating, with a processor of the performance prediction system, a predicted change in product performance between the first location and the second location by calculating a difference between a predicted performance value at the second location and a predicted performance value at the first location. In some embodiments, the graphical user interface is also programmed to display an indication of the predicted change in product performance between the first location and the second location. In some embodiments, the method also includes generating, with a processor of the performance prediction system, a predicted change in sales, units sold, or profit margin for a product category in response to relocating a product within the product category from a first location to a second location. In some embodiments, relocating a first product from a first location to a second location displaces a second product from the second location to a third location, and the method further includes generating, with a processor of the performance prediction system, a predicted change in product performance of the second product between the second location and the third location. In some embodiments, the method also includes generating, with a processor of the performance prediction system, an optimum placement of the at least one product within the display area based on the predicted change in product performance. In some embodiments, the method also includes receiving at a server of the performance prediction system, customer data in an electronic format, the customer data being included in the calculation of the predicted performance value. In some embodiments, the customer data includes at least one of average customer height, average customer age, customer loyalty, customer growth rate, average customer household size, customer home ownership statistics, customer ethnicity statistics, total customer population, average customer income, or customer gender statistics. In some embodiments, the method also includes receiving at a server of the performance prediction system, store data in an electronic format, the store data being included in the calculation of the predicted performance value. In some embodiments, the store data includes at least one of store promotions, store size, number of registers, trade area population, or store income levels. In some embodiments, the method also includes receiving at a server of the performance prediction system, display area data in an electronic format, the display area data being included in the calculation of the predicted performance value. In some embodiments, the display area data includes at least one of display area dimensions, number of facings within the display area, or location of the display area within a store.

In accordance with exemplary embodiments, a system for simulating product performance based on physical and economic attributes associated with a product and a product display area in a retail location is disclosed. The system includes one or more servers programmed to receive, in an electronic computer-readable format, product attribute data corresponding to physical and economic attributes of a product, product location data representing a first physical location of the product within a display area of a store, and historical product performance data. The one or more servers are also programmed to create a model of the product at the first physical location based on the product attribute data and the historic data. The one or more servers are also programmed to simulate product performance for the product using the model to generate a predicted performance value for the product at a second physical location within the display area of the store. The one or more servers are also programmed to transmit instructions to render the simulation of the product performance in a graphical user interface, and depicting within the graphical user interface, the predicted performance value In accordance with exemplary embodiments, a non-transitory computer readable medium storing instructions executable by a processing device, is disclosed, wherein execution of the instructions causes the processing device to implement a method of simulating product performance based on physical and economic attributes associated with a product and a product display area in a retail location. The method implemented upon execution of the instructions by the processing device includes receiving, in an electronic computer-readable format, product attribute data corresponding to physical and economic attributes of a product, product location data representing a first physical location of the product within a display area of a store, and historical product performance data. The method further includes creating a model of the product at the first physical location based on the product attribute data and the historic data. The method further includes simulating product performance for the product using the model to generate a predicted performance value for the product at a second physical location within the display area of the store. The method further includes transmitting instructions to render the simulation of the product performance in a graphical user interface, and depicting within the graphical user interface, the predicted performance value.

Any combination or permutation of embodiments is envisioned.

BRIEF DESCRIPTION OF THE DRAWINGS

The foregoing and other features and advantages provided by the present disclosure will be more fully understood from the following description of exemplary embodiments when read together with the accompanying drawings, in which.

DETAILED DESCRIPTION

I. General Overview

Provided herein are methodologies, systems, apparatus, and non-transitory computer-readable media for simulating product performance based on physical and economic attributes associated with a product and a product display area in a retail location.

According to conventional methodologies, it is generally known that products perform better with respect to various sales and performance metrics when they are disposed on a shelf at eye level. However, the techniques disclosed herein allow a user to determine the performance impact on particular items based on the item or product's attributes and their specific physical location or movement within a modular shelf or display area of a store. The techniques disclosed and claimed can estimate the impact on sales, units, profit margin, etc. resulting from moving an item from one position to a different position on a display area. Each location where a product may be placed within a display area or store shelving unit can be assigned an x-y coordinate corresponding to a physical location in a display area in order to determine location change within the display area. Sales data and item attributes are collected for each item within a store, and this data is used to create a model that can be used predict the impact on sales that will result from moving particular items from one location in a display area to another location in response to execution of a simulation.

In exemplary embodiments, product sales at various locations within a display area follow a gamma distribution, and an equation may be derived for each level of a display area. This equation can then be used to estimate a sales quantity for each brand and product size combination across various display area levels. This sales quantity can be compared against historical product sales data, and a gamma regression can be used to estimate the product performance at each level. In exemplary embodiments, the predicted sales quantity follows equation (1) below.

$$\mu_i = E(Y_i) = e^{\beta_0} x_{i1}^{\beta_1} \ldots x_{ip}^{\beta_p} \qquad (1)$$

In equation (1) above, $e^{\beta_0}$) corresponds to the product location information, or the location of a product on a display area, while $x_{i1}^{\beta_1} \ldots x_{i2}^{\beta_2}$ correspond to a normalized value representing product price, product volume, product size, or any other product, customer, or store attribute. Example attributes may include package size, product category, product ingredients, brand recognition, height of target demographic, customer loyalty, seasonality, store size, price, income level of surrounding area, average household size in surrounding area, home ownership in surrounding area, etc. For example, moving a bag of dog food of a particular brand, package size, and price from the bottom shelf to the fourth shelf within a modular in a store having a certain size and average income level of shoppers may be predicted to cause an increase in sales (e.g., a 2.5% increase). The predicted sales value for specific products placed at specific x-y locations within a modular may be calculated based on a combination of item attributes and sales data for items at each location within a display area.

The impact on sales is determined by the difference in predicted sales value and current sales value.

In exemplary embodiments, the β coefficients in the product model equation (1) can account for the fact that different product attributes may have a larger impact on product sales and different brands have larger sales volume or market share. For example, in the cold cereal category, brand flavor and sugar content are generally the most important attributes. In exemplary embodiments, product brands may be divided into ten categories based on how well they sell, with the highest selling brands being assigned to the first category and the lowest selling brands assigned to the tenth category. For each category, the sales will be similar for each brand of cold cereal if the sugar content and flavor combination is the same. The same or similar β coefficient can be assigned to products within each category. Thus, for an example display area that has five vertical shelves, 50 equations may be used to estimate units sold: one for each of the ten brand categories at each of the five display area levels. Using the product model, a user can estimate the sales performance of various products by manipulating product attributes, dividing products into categories based on how well a brand sells and/or similar product attributes, and assigning the same or similar β coefficients to products in the same category.

In exemplary embodiments, a modular planning tool may be displayed on an electronic device via a GUI that allows a user to virtually arrange items within a virtual display area corresponding to or representing a physical display area, and to create various item placement scenarios to be simulated. Based on the predicted sales value for each product at each location, the impact on sales, units, profit margin, return on investment, etc. that may result from relocating items within a modular can be determined via the simulations performed using the modular planning tool.

Exemplary embodiments are described below with reference to the drawings. One of ordinary skill in the art will recognize that exemplary embodiments are not limited to the illustrative embodiments, and that components of exemplary systems, devices and methods are not limited to the illustrative embodiments described below.

II. Exemplary Inventory Identification Operations

Exemplary systems, devices, methods, and non-transitory computer-readable media can be used to define and execute one or more product performance simulation operations in which product data is used to create a product model, and then a predicted performance value is generated and rendered via a GUI. In other exemplary embodiments, the GUI may allow a user to relocate products within a virtual display area and view a predicted change in performance value resulting from the relocation.

Figure 1:
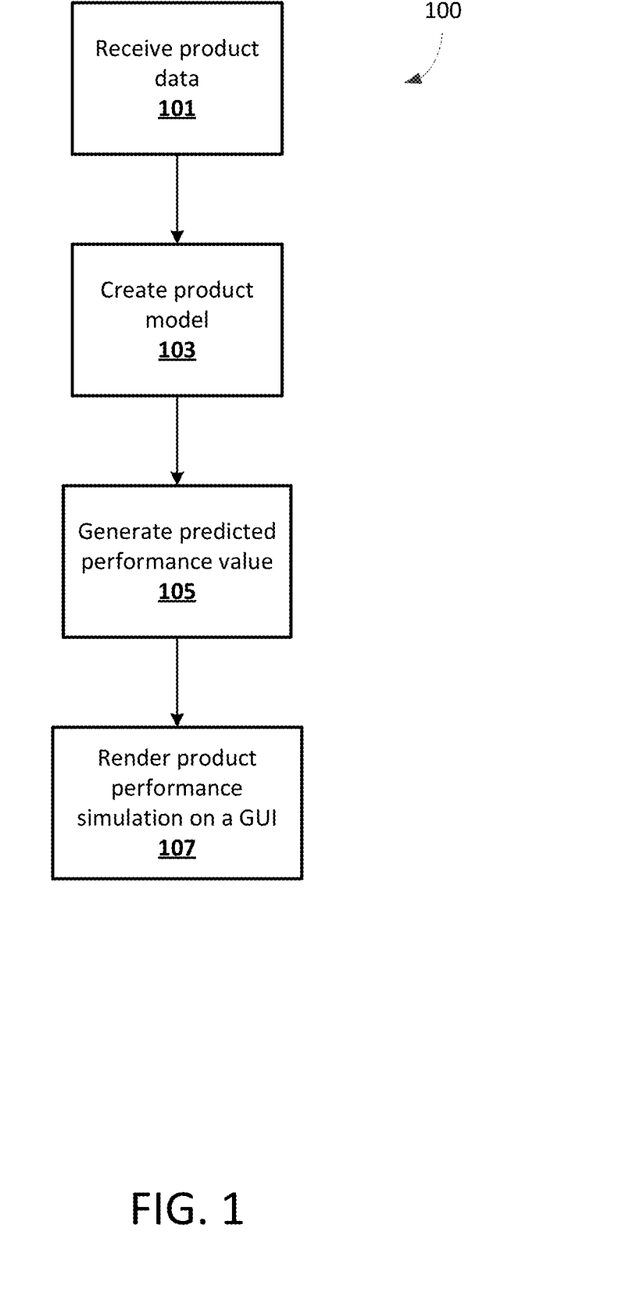
FIG. 1 is a flowchart illustrating an exemplary method of simulating product performance, according to embodiments of the present disclosure.

FIG. 1 is a flowchart that illustrates an exemplary method 100 of simulating product performance and rendering a predicted product performance value via a GUI using the modular planning tool, according to embodiments of the present disclosure.

In step 101, one or more computing devices receive product data in an electronic computer-readable format. In some embodiments, the one or more computing device can be one or more servers of a server environment. In exemplary embodiments, the product data includes product attribute data corresponding to physical and economic attributes of a product. The product attribute data may also include, for example, data representing a product's shelf life, shelf volume, price, size, weight, shape, brand, seasonality, market share, marketing data, or a product's brand contribution to the overall sales of a specific category of products. The product data also includes product location data representing an initial physical location of a product within a display area of a store. The physical location data can be, for example, a specific x-y coordinate value representing the product's horizontal and vertical location within a display area or modular. The product data also includes historical product performance data for the particular product. The historical product performance data can include, for example, data representing sales statistics, units sold, or profit margin statistics corresponding to a particular product at various locations within the display area.

In step 103, the one or more computing devices create a model of the product at the first physical location within the display area based on the product attribute data and the historical performance data of that product at a specific location within a display area. In exemplary embodiments, this model is created based on product attribute data and historical performance data gathered over significant periods of time. The model can be created as disclosed above in reference to equation (1), in exemplary embodiments. For example, sales or profit data can be collected for one or more years with respect to various products at various locations within a display area, and this data can be compiled to generate the product model. In exemplary embodiments, this product model can be updated periodically or seasonally in order to more accurately reflect a product's performance at a given location within a display area.

In step 105, the one or more computing devices simulate product performance of the product using the created model and generate a predicted performance value for the product at a second physical location within the display area in response to the simulation. This predicted performance value is based on the model created in step 103 and is representative of the estimated or predicted performance of a particular product at the second location within the display area or modular. The predicted performance value can be representative of a predicted sales value, a predicted number of units sold, or a predicted profit margin of a product.

In exemplary embodiments, the determination of the predicted performance value can be improved by including customer data relating to a customer demographic for a specific product or a specific retail store location. The customer data can include, for example, average customer height, average customer age, customer loyalty, customer growth rate, average customer household size, customer home ownership statistics, customer ethnicity statistics, total customer population, average customer income, customer gender statistics, etc. In exemplary embodiments, the determination of the predicted performance value can also include store data relating to a store where the product display area is to be located. The store data can include, for example, store promotion data, store size, the number of registers within the store, the trade area population of the store, average store income data, etc. In other exemplary embodiments, the determination of the predicted performance value can also include display area data, such as, display area dimensions, the number of facings within the display area, the location of the display area within a store, etc. In exemplary embodiments, the one or more computing devices can write or store the product attribute data, product location data, historical product performance data, predicted performance value, customer data, store data, display area data, etc. to a database, e.g., within a server environment.

In step 107, the one or more computing devices can render the simulation of the product performance via a GUI on an electronic display device. As one example, for embodiments in which the one or more computing devices are servers, the servers can transmit instructions to a client computing device to instruct the client computing device to render the simulation of the product performance via a GUI associated with the electronic display device of the client computing device. The GUI that can be rendered on the electronic display device also depicts the predicted performance value generated in step 105. An exemplary GUI can be programmed to receive the product attribute data, product location data, historical product performance data, etc. in an electronic format from the one or more servers. In exemplary embodiments, a user of the electronic display device can interact with the GUI via a touch-screen UI, or any other suitable UI, such as a keyboard or microphone. The one or more computing devices can be local or remote to the electronic display device, and interactions between the one or more computing devices and the display device can take place over a wired or wireless network, in various embodiments.

Figure 2:
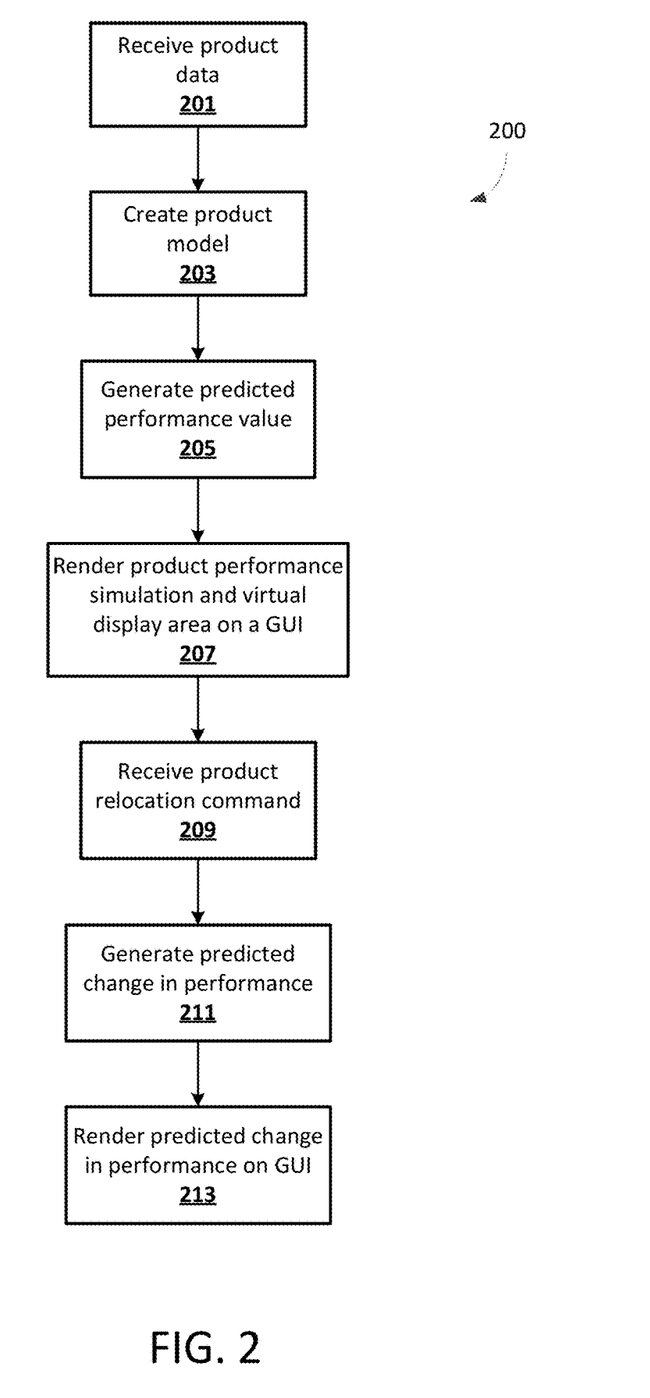
FIG. 2 is a flowchart illustrating another exemplary method of simulating product performance, according to embodiments of the present disclosure.

FIG. 2 is a flowchart that illustrates an exemplary method 200 of simulating product performance and rendering a predicted product performance value and a virtual display area is a GUI using the modular planning tool, according to embodiments of the present disclosure.

In step 201, one or more computing devices receive product data in an electronic computer-readable format. In some embodiments, the one or more computing device can be one or more servers of a server environment. In exemplary embodiments, the product data includes product attribute data corresponding to physical and economic attributes of a product. The product attribute data may also include, for example, data representing a product's shelf life, shelf volume, price, size, weight, shape, brand, seasonality, market share, marketing data, or a product's brand contribution to the overall sales of a specific category of products. The product data also includes product location data representing an initial physical location of a product within a display area of a store. The physical location data can be, for example, a specific x-y coordinate value representing the product's horizontal and vertical location within a display area or modular. The product data also includes historical product performance data for the particular product. The historical product performance data can include, for example, data representing sales statistics, units sold, or profit margin statistics corresponding to a particular product at various locations within the display area.

In step 203, the one or more computing devices create a model of the product at the first physical location within the display area based on the product attribute data and the historical performance data of that product at a specific location within a display area. In exemplary embodiments, this model is created based on product attribute data and historical performance data gathered over significant periods of time. The model can be created as disclosed above in reference to equation (1), in exemplary embodiments. For example, sales or profit data can be collected for one or more years with respect to various products at various locations within a display area, and this data can be compiled to generate the product model. In exemplary embodiments, this product model can be updated periodically or seasonally in order to more accurately reflect a product's performance at a given location within a display area.

In step 205, the one or more computing devices simulate product performance of the product using the created model and generate a predicted performance value for the product at a second physical location within the display area in response to the simulation. This predicted performance value is based on the model created in step 203 and is representative of the estimated or predicted performance of a particular product at the second location within the display area or modular. The predicted performance value can be representative of a predicted sales value, a predicted number of units sold, or a predicted profit margin of a product. In exemplary embodiments, the calculation of the predicted performance value can also include customer data relating to a customer demographic for a specific product or a specific retail store location. The customer data can include, for example, average customer height, average customer age, customer loyalty, customer growth rate, average customer household size, customer home ownership statistics, customer ethnicity statistics, total customer population, average customer income, customer gender statistics, etc. In exemplary embodiments, the calculation of the predicted performance value can also include store data relating to a store where the product display area is to be located. The store data can include, for example, store promotion data, store size, the number of registers within the store, the trade area population of the store, average store income data, etc. In other exemplary embodiments, the calculation of the predicted performance value can also include display area data, such as, display area dimensions, the number of facings within the display area, the location of the display area within a store, etc. In exemplary embodiments, the one or more servers can write or store the product attribute data, product location data, historical product performance data, predicted performance value, customer data, store data, display area data, etc. to a database, e.g., within a server environment.

In step 207, the one or more computing devices can render the simulation of the product performance and a virtual display area via a GUI on an electronic display device. As one example, for embodiments in which the one or more computing devices are servers, the servers can transmit instructions to a client computing device to instruct the client computing device to render the simulation of the product performance via a GUI associated with the electronic display device of the client computing device. The GUI that can be rendered on the electronic display device also depicts the predicted performance value generated in step 205, and the virtual display area includes a graphical indicator of at least one product at a first location within the virtual display area. The graphical indicator represents the product at the first physical location within the display area. As described above, an exemplary GUI can be programmed to receive the product attribute data, product location data, historical product performance data, etc. in an electronic format from the one or more computers. In exemplary embodiments, a user can interact with the GUI via a touch-screen UI, or any other suitable UI, such as a keyboard or microphone to control an operation of the. The one or more computers can be local or remote to the electronic display device, and interactions between the one or more computing devices and the display device can take place over a wired or wireless network, in various embodiments.

In step 209, the GUI of the one or more computing devices receive a user input and converts the user input to instructions for relocating the at least one product from the first location to a second location within the virtual display area. The graphical user interface is further programmed to display the graphical indicator of the product at the second location in response to the user input. In exemplary embodiments, a user can interact with the GUI and input commands e.g., via a physical or virtual keyboard or touch screen, selection of options from a drop-down menu, selection of a check box, or any other suitable user input technique. In exemplary embodiments, the user input includes a drag-and-drop command performed via a pointing device of the electronic display device. The pointing device may include, for example, a pen, stylus, mouse, track pad, touch-sensitive screen, etc.

In step 211, the one or more computing devices execute a simulation to generate a predicted change in product performance in response to a product being relocated within the virtual display area based on the created model. This predicted change in product performance value represents a predicted change in sales, units sold, profit margin, etc. that would result from a particular product being moved to a new location within a physical display area. In exemplary embodiments, the predicted change in performance value can be calculated based on the difference in predicted performance values between two locations within the virtual modular.

In step 213, the one or more computing devices can render the predicted change in product performance via the GUI on the electronic display device. In exemplary embodiments, relocating a first product from a first location to a second location within the virtual display area displaces a second product from the second location to a third location. In such embodiments, the GUI can display the second product relocated at the third location, and the one or more computing devices can generate a predicted change in product performance for the second product between the second location and the third location in response to execution of a simulation using the created model. In exemplary embodiments, in response to the simulation, the one or more computing devices can generate an optimum or recommended placement of at least one product within the display area based on the predicted performance value of the product at various locations within the display area, or based on the predicted change in product performance.

III. Exemplary Graphical User Interfaces

Figure 3A:
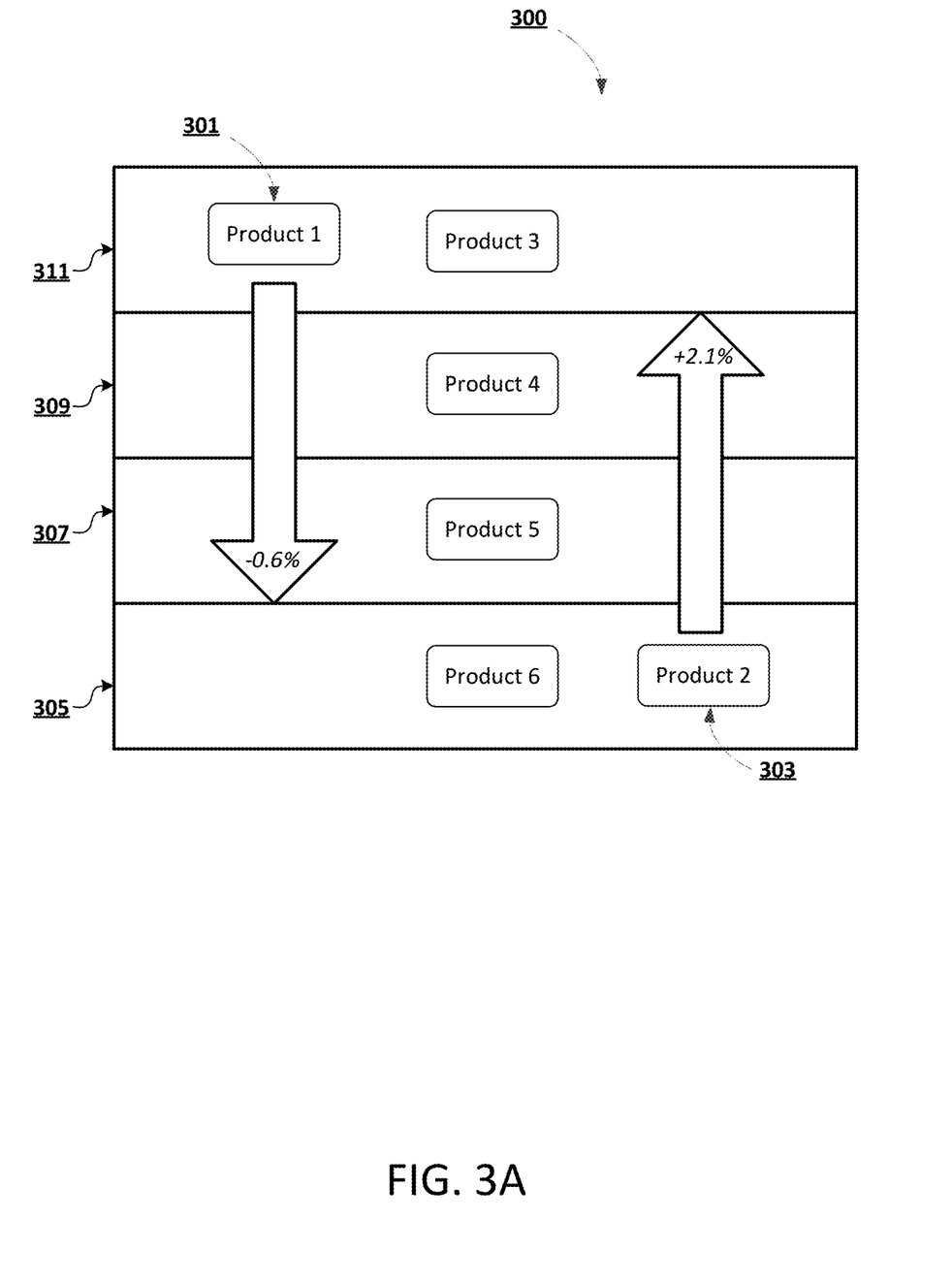
FIG. 3A depicts an exemplary virtual product display area for simulating product performance, according to embodiments of the present disclosure.

FIG. 3A depicts an example virtual display area 300 that can be rendered via the GUI on an electronic display device using the modular planning tool. In exemplary embodiments, the virtual display area includes a first level 305 is located closest to the floor, a second level 307 above the first, a third level 309, and a fourth level 311. The virtual display area or modular can also include graphical indicators representing various products 1-6 at various locations within the virtual display area. In this particular embodiment, a first product 301 is located at a first location on the fourth level 311 closer to the left hand side of the display area, while a second product 303 is located initially on the first level closer to the right hand side of the display area. As discussed above, a model of each product at various locations within a display area is created based on the product attribute data, product location data, and historical product performance data. The model can be created as disclosed above in reference to equation (1), in exemplary embodiments. Once this model is created, a predicted performance value may be generated in response to a simulation of the product performance at a second location within the display area. In the example shown in FIG. 3A, a predicted performance value of −0.6% is generated and rendered via a GUI in response to a simulation of the first product 301 being relocated from its first position on the fourth level 311 to a second position on the first level 305. Similarly, a predicted performance value of +2.1% is generated and rendered via the GUT in response to a simulation of the second product 303 being relocated from its first position on the first level 305 to a second position on the fourth level 311. The predicted change in product performance represents a predicted change in sales, units sold, profit margin, etc. that would result from a particular product being moved to a new location within a physical display area. In exemplary embodiments, a user may interact with the GUI and relocate the various graphical indicators to different locations within the virtual display area 300 using, for example, a mouse, track pad, touch-sensitive screen, or other suitable user input techniques. The predicted performance values and/or predicted change in performance values may alternatively be displayed to a user in a format similar to Table 1 below.

TABLE 1

|  |  | Second Location | | | | |
| --- | --- | --- | --- | --- | --- | --- |
|  | Levels | 1 | 2 | 3 | 4 | 5 |
| First | 1 | 0% | 1% | 10% | 7% | −4% |
| Location | 2 | −1% | 0% | 8% | 5% | −6% |
|  | 3 | −11% | −9% | 0% | −3% | −15% |
|  | 4 | −7% | −6% | 3% | 0% | −12% |
|  | 5 | 4% | 5% | 13% | 11% | 0% |

Table 1 presents the percent change in sales statistics for a particular product if that product is relocated from a first position to a second position within a display area, according to exemplary embodiments. Specifically, if the product is relocated from the second level of a display area to the third level of the display area, the sales statistics for this product will increase by 8%. By reviewing Table 1, it can be concluded that the optimum location for this particular product is either on the third or fourth level of the display area. In other exemplary embodiments, the predicted performance values and/or predicted change in performance values may be represented in revenue or profits per week, units sold per week, or some other product performance index.

Figure 3B:
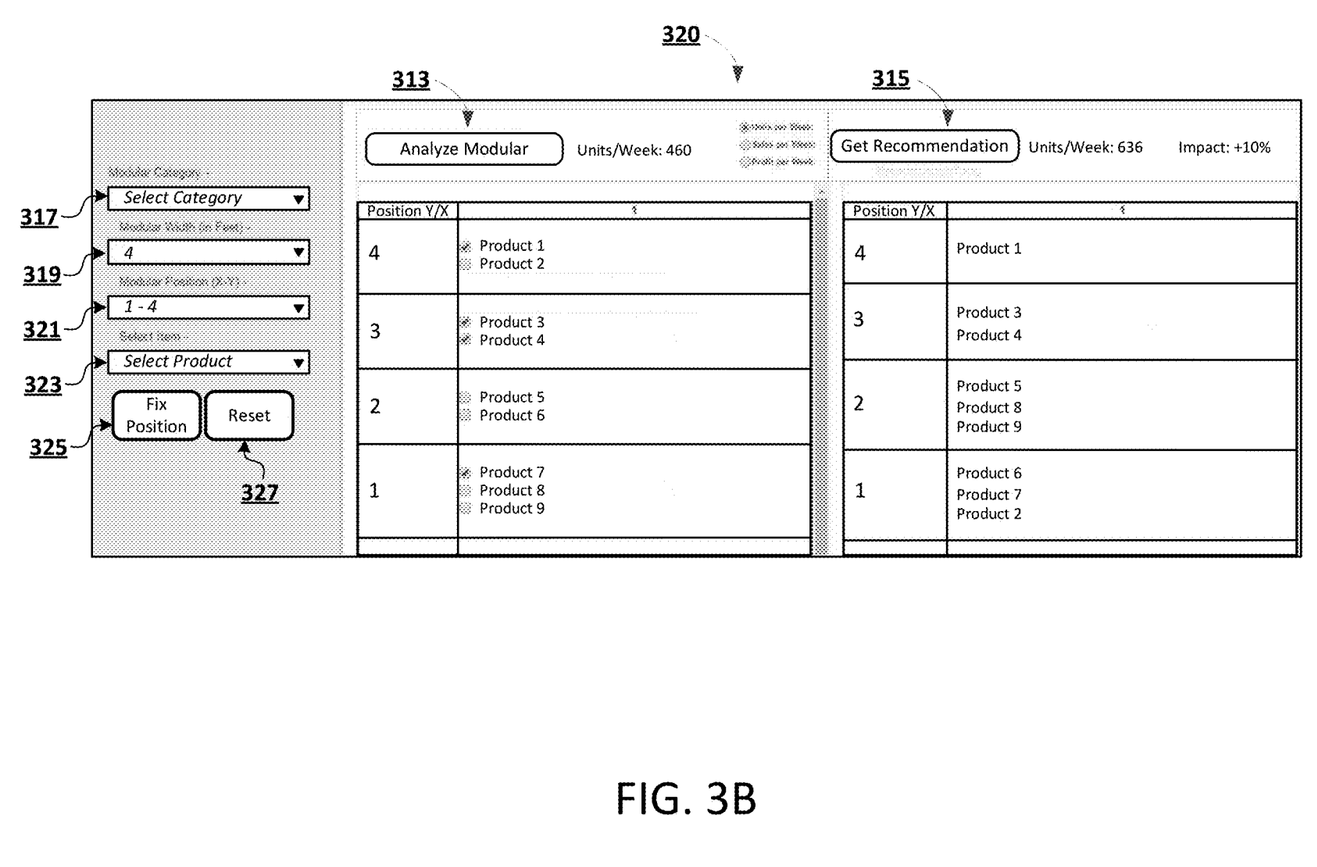
FIG. 3B depicts an exemplary graphical user interface for simulating product performance and generating a product placement recommendation, according to embodiments of the present disclosure.

FIG. 3B depicts an example GUI 320 that can be provided by the modular planning tool for simulating product performance and generating a product placement recommendation, according to embodiments of the present disclosure. In exemplary embodiments, the GUI can allow a user to select a product category 317, the width 319 of the virtual display area or modular, the product location 321 or the specific product 323. The product location can be input as an x-y coordinate value, in exemplary embodiments. The various input fields 317, 319, 321, and 323 may be populated manually using, for example, a touchscreen or physical keyboard, or by selecting an option from a drop-down menu. The GUI can also display a UI button or control feature to fix a product's position 325 at a desired location, or to reset 327 the selectable parameters 317-323. In this particular embodiment, products 1-2 are positioned on the fourth level of the virtual display area, products 3-4 are on the third level, products 5-6 are on the second level, and products 7-9 are on the first level. Above the virtual modular, a UI button 313 allows a user to analyze the modular and generate a predicted performance value for one or more products at the various locations selected. In this particular example, a predicted performance value of 460 units/week is calculated for the products arranged in this configuration.

As can be seen in this exemplary embodiment, check boxes to the left of products 1, 3, 4, and 7 have been selected, indicating that their positions are to remain fixed within the display area. A user can then select a "get recommendation" UI button 315 in order to calculate an optimum or recommended position for other products within the display area. In this exemplary embodiment, products 1, 3, 4, and 7 remain in their original locations, while product 6 relocates to the first level of the display area, products 8-9 relocate to the second level of the display area, and product 2 relocates to the first level of the display area. The predicted performance value of this recommended configuration is displayed as 636 units/week, which represents a 10% increase in sales over the previous configuration. In exemplary embodiments, the one or more servers can calculate and render via the GUT optimal adjacencies of various products based on the predicted performance values and/or predicted change in product performance.

As will be appreciated, the exemplary user interfaces shown in FIGS. 3A-3B are presented merely as non-limiting examples of GUI that can be provided by embodiments of the modular planning tool and the manner in which relevant information may be received for simulating product performance, as disclosed herein. Numerous other embodiments will be apparent in light of this disclosure. Other embodiments may, for example, include additional or fewer input fields, or automatically fill certain fields.

IV. Exemplary Network Environments

Figure 4:
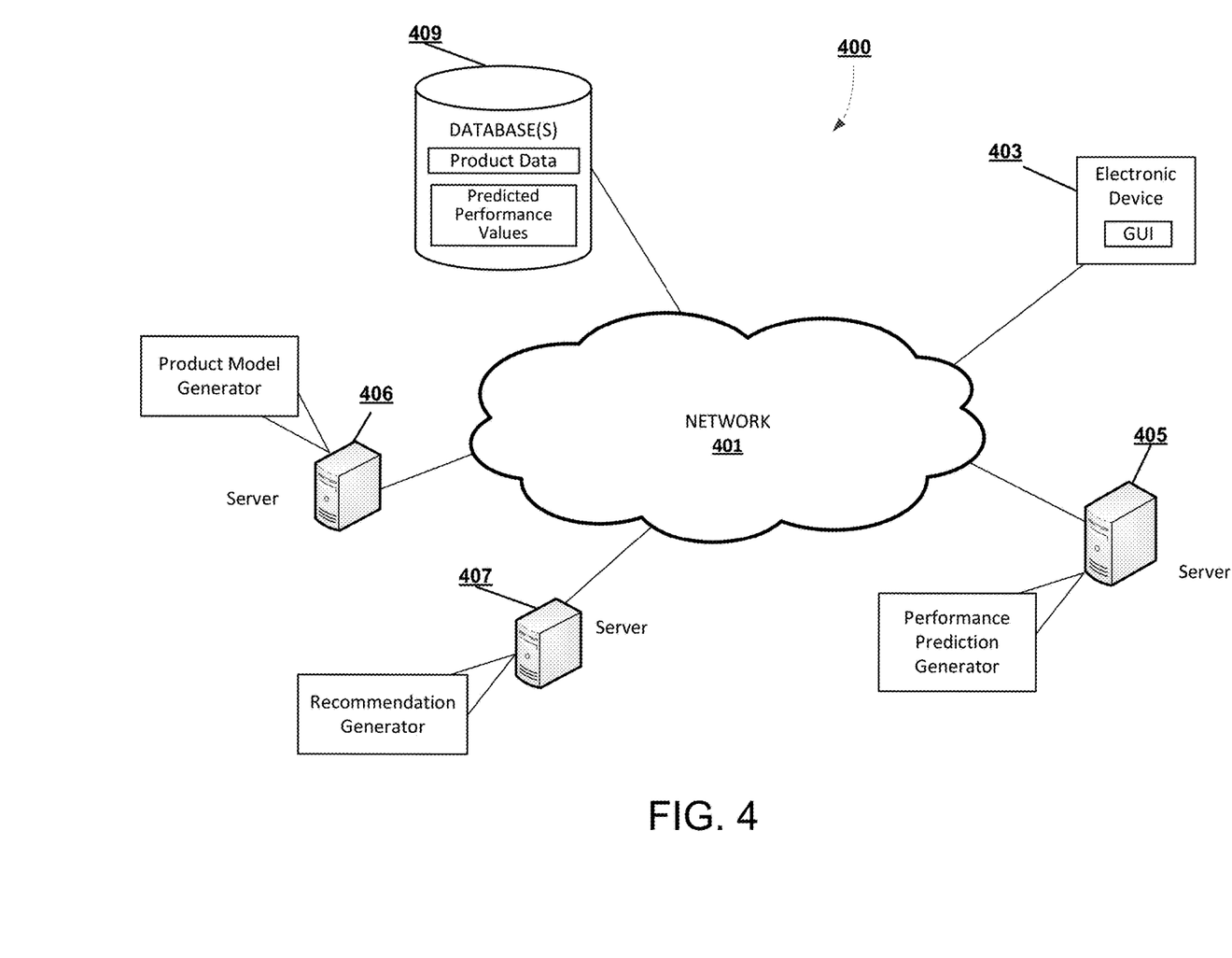
FIG. 4 is a block diagram of an exemplary computing device that can be used to perform exemplary processes in accordance with exemplary embodiments of the present disclosure.

FIG. 4 is a diagram of an exemplary network environment 400 suitable for a distributed implementation of exemplary embodiments. The network environment 400 can include one or more servers 405, 406, and 407. As will be appreciated, various distributed or centralized configurations may be implemented, and in some embodiments a single server can be used. The network environment may also include a database 409, associated with servers 405, 406, and 407. In exemplary embodiments, the database 409 can store the various product data and/or predicted performance values, while the one or more servers 405, 406, and 407 can store a performance prediction generator, recommendation generator, and/or product model generator associated with the modular planning tool, which can be executed to implement one or more processes of the modular planning tool including for example, processes described herein with respect to FIGS. 1 and 2. The network environment may also include a client device 403, that may be display GUIs to a user as described above in reference to FIGS. 3A-3B. Once the client device 403 receives instructions from the one or more servers 405, 406, and 407, the GUI may be rendered on the electronic device 403 to allow a user of the client device 403 to interact with the servers to implement embodiments of the modular planning tool.

In exemplary embodiments, the servers 405, 406, and 407, database 409, and the client device 403 may be in communication with each other via a communication network 401. The communication network 401 may include, but is not limited to, the Internet, an intranet, a LAN (Local Area Network), a WAN (Wide Area Network), a MAN (Metropolitan Area Network), a wireless network, an optical network, and the like. In exemplary embodiments, the electronic device 403 that is in communication with the servers 405, 406, and 407 and database 409 can generate and transmit a database query requesting information from the raw data matrices or database 409. As described above in reference to FIGS. 1-2, the one or more servers 405, 406, and 407 can transmit instructions to the electronic device 403 over the communication network 401.

In exemplary embodiments, the product attribute data, product location data, and product performance data can be stored at database 409 and received at the one or more servers 405, 406, and 407 in order to create the product model and generate a predicted performance value for the product at one or more locations within a display area. The servers 405, 406, and 407 can interact with the electronic device 403 and database 409 over communication network 401 to render the GUIs, e.g., shown in FIGS. 3A and 3B, on the electronic device 403, as described above in reference to FIGS. 1-2.

V. Exemplary Computing Devices

Figure 5:
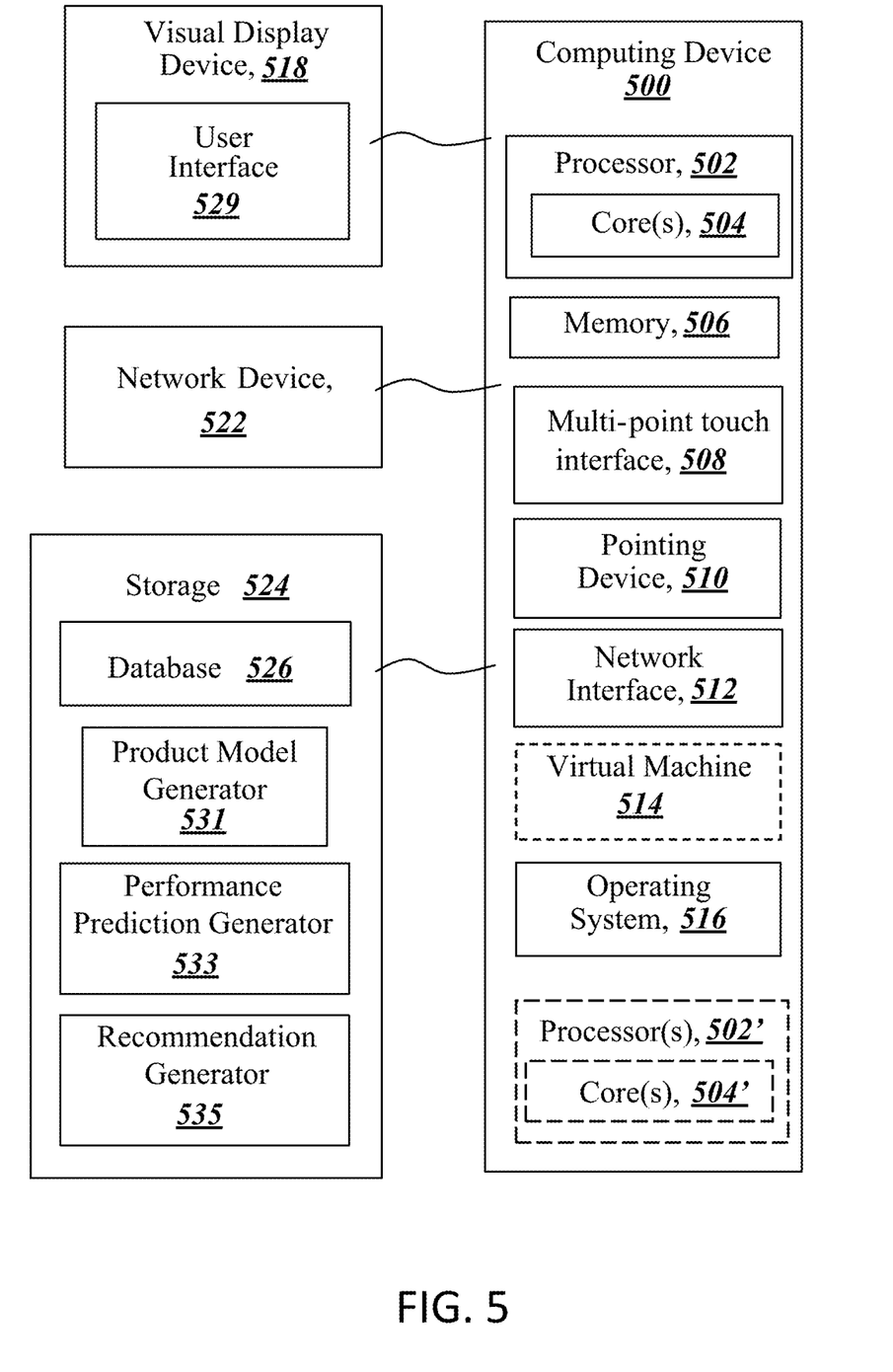
FIG. 5 is a diagram of an exemplary network environment suitable for a distributed implementation of exemplary embodiments of the present disclosure.

FIG. 5 is a block diagram of an exemplary computing device 500 that can be used to perform the methods provided by exemplary embodiments. The computing device 500 includes one or more non-transitory computer-readable media for storing one or more computer-executable instructions or software for implementing exemplary embodiments. The non-transitory computer-readable media can include, but are not limited to, one or more types of hardware memory, non-transitory tangible media (for example, one or more magnetic storage disks, one or more optical disks, one or more USB flashdrives), and the like. For example, memory 506 included in the computing device 500 can store computer-readable and computer-executable instructions or software for implementing exemplary embodiments, such as a product model generator 531, performance prediction generator 533, and/or a recommendation generator 535 associated with embodiments of the modular planning tool and programmed to perform processes described herein. The computing device 500 also includes processor 502 and associated core 504, and optionally, one or more additional processor(s) 402' and associated core(s) 504' (for example, in the case of computer systems having multiple processors/cores), for executing computer-readable and computer-executable instructions or software stored in the memory 506 and other programs for controlling system hardware. Processor 502 and processor(s) 502' can each be a single core processor or multiple core (504 and 504') processor.

Virtualization can be employed in the computing device 500 so that infrastructure and resources in the computing device can be shared dynamically. A virtual machine 514 can be provided to handle a process running on multiple processors so that the process appears to be using only one computing resource rather than multiple computing resources. Multiple virtual machines can also be used with one processor.

Memory 506 can be non-transitory computer-readable media including a computer system memory or random access memory, such as DRAM, SRAM, EDO RAM, and the like. Memory 506 can include other types of memory as well, or combinations thereof.

A user can interact with the computing device 500 through a visual display device 518, such as a touch screen display or computer monitor, which can display one or more user interfaces 529 that can be provided in accordance with exemplary embodiments, for example, the exemplary interfaces illustrated in FIGS. 3A-3B. The visual display device 518 can also display other aspects, elements and/or information or data associated with exemplary embodiments, for example, views of databases, maps, tables, graphs, charts, and the like. The computing device 300 can include other I/O devices for receiving input from a user, for example, a keyboard or any suitable multi-point touch interface 508, a pointing device 510 (e.g., a pen, stylus, mouse, or trackpad). The keyboard 508 and the pointing device 510 can be coupled to the visual display device 518. The computing device 500 can include other suitable conventional I/O peripherals.

The computing device 500 can also include one or more storage devices 524, such as a hard-drive, CD-ROM, or other non-transitory computer readable media, for storing data and computer-readable instructions and/or software, such as the product model generator 531, the performance prediction generator, and the recommendation generator, which may generate user interface 529 that implements exemplary embodiments of the product performance simulation system as taught herein, or portions thereof. Exemplary storage device 524 can also store one or more databases for storing any suitable information required to implement exemplary embodiments. The databases can be updated by a user or automatically at any suitable time to add, delete or update one or more items in the databases. Exemplary storage device 524 can store one or more databases 526 for storing product attribute data, product location data, product performance data, customer data, display area data, store data, predicted performance values, and any other data/information used to implement exemplary embodiments of the systems and methods described herein.

The computing device 500 can include a network interface 512 configured to interface via one or more network devices 522 with one or more networks, for example, Local Area Network (LAN), Wide Area Network (WAN) or the Internet through a variety of connections including, but not limited to, standard telephone lines, LAN or WAN links (for example, 802.11, T1, T3, 56 kb, X.25), broadband connections (for example, ISDN, Frame Relay, ATM), wireless connections, controller area network (CAN), or some combination of any or all of the above. The network interface 512 can include a built-in network adapter, network interface card, PCMCIA network card, card bus network adapter, wireless network adapter, USB network adapter, modem or any other device suitable for interfacing the computing device 500 to any type of network capable of communication and performing the operations described herein. Moreover, the computing device 500 can be any computer system, such as a workstation, desktop computer, server, laptop, handheld computer, tablet computer (e.g., the iPad® tablet computer), mobile computing or communication device (e.g., the iPhone® communication device), or other form of computing or telecommunications device that is capable of communication and that has sufficient processor power and memory capacity to perform the operations described herein.

The computing device 500 can run any operating system 516, such as any of the versions of the Microsoft® Windows® operating systems, the different releases of the Unix and Linux operating systems, any version of the MacOS® for Macintosh computers, any embedded operating system, any real-time operating system, any open source operating system, any proprietary operating system, any operating systems for mobile computing devices, or any other operating system capable of running on the computing device and performing the operations described herein. In exemplary embodiments, the operating system 516 can be run in native mode or emulated mode. In an exemplary embodiment, the operating system 516 can be run on one or more cloud machine instances.

VI. Equivalents

In describing exemplary embodiments, specific terminology is used for the sake of clarity. For purposes of description, each specific term is intended to at least include all technical and functional equivalents that operate in a similar manner to accomplish a similar purpose. Additionally, in some instances where a particular exemplary embodiment includes a plurality of system elements, device components or method steps, those elements, components or steps can be replaced with a single element, component or step. Likewise, a single element, component or step can be replaced with a plurality of elements, components or steps that serve the same purpose. Moreover, while exemplary embodiments have been shown and described with references to particular embodiments thereof, those of ordinary skill in the art will understand that various substitutions and alterations in form and detail can be made therein without departing from the scope of the invention. Further still, other aspects, functions and advantages are also within the scope of the invention.

Exemplary flowcharts are provided herein for illustrative purposes and are non-limiting examples of methods. One of ordinary skill in the art will recognize that exemplary methods can include more or fewer steps than those illustrated in the exemplary flowcharts, and that the steps in the exemplary flowcharts can be performed in a different order than the order shown in the illustrative flowcharts.

What is claimed is:

1. A method of simulating product performance and displaying within a graphical user interface a virtual arrangement of products, the method comprising:

receiving, in an electronic computer-readable format, via one or more servers, product attribute data corresponding to physical and economic attributes of a product and historical product performance data;

receiving, in an electronic computer-readable format, via the one or more servers, product location data representing a first physical location of the product within a display area of a store having a plurality of vertical display levels, the first physical location including a first x-y coordinate value representing a first horizontal and vertical location of the product within the display area;

creating, via the one or more servers, a model of the product at the first physical location based on the product attribute data and the historical product performance data, the model created by obtaining the historical product performance data and the product attribute data for a predefined period of time with respect to various products at various locations within the display area, the model configured to estimate product performance at each of the vertical display levels based on a gamma distribution;

simulating, via the one or more servers, product performance for the product using the model to generate a predicted performance value for the product at the plurality of vertical display levels within the display area of the store;

rendering, in a graphical user interface associated with an electronic display device of a client computing device, the simulation of the product performance, and depicting within the graphical user interface, the predicted performance value;

displaying within the graphical user interface a virtual arrangement of the various products within the plurality of vertical display levels within a virtual display area of the store, the virtual display area corresponding to the display area of the store, the virtual arrangement including a first graphical indicator of the product at the first physical location within the virtual display area;

virtually rearranging the product within the virtual display area displayed within the graphical user interface by dragging-and-dropping the product to a second physical location, the second physical location including a second x-y coordinate value representing a second horizontal and vertical location of the product within the display area;

displaying within the graphical user interface a virtual rearrangement of the various products within the plurality of vertical display levels within the virtual display area, including a second graphical indicator of the product at the second physical location within the virtual display area;

generating, via the one or more servers, a predicted change in the predicted performance value based on the created model in response to the product being relocated within the virtual display area; and displaying within the graphical user interface the predicted change in product performance resulting from the rearrangement of the product to the second physical location within the virtual display area.

2. The method of claim 1, wherein the product attribute data is representative of product shelf volume, product price, product size, product weight, product shape, product shelf life, product brand, product seasonality, product marketing, product market share, or product brand contribution to category sales.

3. The method of claim 1, wherein the historical product performance data is representative of sales, units sold, or profit margin for the product at each location within the display area.

4. The method of claim 1, further comprising receiving, via the graphical user interface, user input relocating the product from the first location to the second location within the virtual display area, the graphical user interface further programmed to display the product at the second location within the virtual display area.

5. The method of claim 4, wherein the user input includes a drag-and-drop command performed via a pointing device of the electronic display device.

6. The method of claim 4, further comprising generating the predicted change in product performance between the first location and the second location by calculating a difference between a predicted performance value at the second location and a predicted performance value at the first location.

7. The method of claim 6, further comprising generating a predicted change in sales, units sold, or profit margin for a product category in response to relocating a product within the product category from a first location to a second location.

8. The method of claim 6, wherein relocating a first product from a first location to a second location displaces a second product from the second location to a third location, the method further comprising generating a predicted change in product performance of the second product between the second location and the third location.

9. The method of claim 6, further comprising generating an optimum placement of the at least one product within the display area based on the predicted change in product performance.

10. A system of simulating product performance and displaying within a graphical user interface a virtual arrangement of products, the system comprising:
one or more servers programmed to:
receive, in an electronic computer-readable format, product attribute data corresponding to physical and economic attributes of a product and historical product performance data;
receive, in an electronic computer-readable format, product location data representing a first physical location of the product within a display area of a store having a plurality of vertical display levels, the first physical location including a first x-y coordinate value representing a first horizontal and vertical location of the product within the display area;
create a model of the product at the first physical location based on the product attribute data and the historical product performance data, the model created by obtaining the historical product performance data and the product attribute data for a predefined period of time with respect to various products at various locations within the display area, the model configured to estimate product performance at each of the vertical display levels based on a gamma distribution;
simulate product performance for the product using the model to generate a predicted performance value for the product at the plurality of vertical display levels within the display area of the store;
render the simulation of the product performance in a graphical user interface, and depicting within the graphical user interface, the predicted performance value; and
display a virtual arrangement of the various products within the plurality of vertical display levels within a virtual display area of the store, the virtual display area corresponding to the display area of the store, the virtual arrangement including a first graphical indicator of the product at the first physical location within the virtual display area;
virtually rearrange the product within the virtual display area displayed within the graphical user interface upon receiving input dragging-and-dropping the product to a second physical location, the second physical location including a second x-y coordinate value representing a second horizontal and vertical location of the product within the display area;
display within the graphical user interface a virtual rearrangement of the various products within the plurality of vertical display levels within the virtual display area of the store, including a second graphical indicator of the product at the second physical location within the virtual display area;
generate a predicted change in the predicted performance value based on the created model in response to the product being relocated within the virtual display area; and
display within the graphical user interface the predicted change in product performance resulting from the rearrangement of the product to the second physical location within the virtual display area.

11. The system of claim 10, wherein the product attribute data is representative of product shelf volume, product price, product size, product weight, product shape, product shelf life, product brand, product seasonality, product marketing, product market share, or product brand contribution to category sales.

12. The system of claim 10, wherein the historical product performance data is representative of sales, units sold, or profit margin for the product at each location within the display area.

13. The system of claim 10, wherein the one or more servers are further programmed to receive via the graphical user interface, user input relocating the product from the first location to the second location within the virtual display area, the graphical user interface further programmed to display the product at the second location within the virtual display area.

14. The system of claim 13, wherein the user input includes a drag-and-drop command performed via a pointing device of the electronic display device.

15. The system of claim 13, wherein the one or more servers are further programmed to generate the predicted change in product performance between the first location and the second location by calculating a difference between a predicted performance value at the second location and a predicted performance value at the first location.

16. The system of claim 15, wherein the one or more servers are further programmed to generate a predicted change in sales, units sold, or profit margin for a product category in response to relocating a product within the product category from a first location to a second location.

17. The system of claim 15, wherein relocating a first product from a first location to a second location displaces a second product from the second location to a third location, the one or more servers further programmed to generate a predicted change in product performance of the second product between the second location and the third location.

18. The system of claim 15, wherein the one or more servers are further programmed to generate an optimum placement of the at least one product within the display area based on the predicted change in product performance.

19. A non-transitory computer readable medium storing instructions executable by a processing device, wherein execution of the instructions causes the processing device to implement a method of simulating product performance and displaying within a graphical user interface a virtual arrangement of products, the method comprising:

receiving, in an electronic computer-readable format, product attribute data corresponding to physical and economic attributes of a product and historical product performance data;

receiving, in an electronic computer-readable format, product location data representing a first physical location of the product within a display area of a store having a plurality of vertical display levels, the first physical location including a first x-y coordinate value representing a first horizontal and vertical location of the product within the display area;

creating a model of the product at the first physical location based on the product attribute data and the historical product performance data, the model created by obtaining the historical product performance data and the product attribute data for a predefined period of time with respect to various products at various locations within the display area, the model configured to estimate product performance at each of the vertical display levels based on a gamma distribution;

simulating product performance for the product using the model to generate a predicted performance value for the product at the plurality of vertical display levels within the display area of the store;

rendering the simulation of the product performance in a graphical user interface, and depicting within the graphical user interface, the predicted performance value;

displaying a virtual arrangement of the various products within the plurality of vertical display levels within a virtual display area of the store, the virtual display area corresponding to the display area of the store, the virtual arrangement including a first graphical indicator of the product at the first physical location within the virtual display area;

virtually rearranging the product within the virtual display area displayed within the graphical user interface upon receiving input dragging-and-dropping the product to a second physical location, the second physical location including a second x-y coordinate value representing a second horizontal and vertical location of the product within the display area;

displaying within the graphical user interface a virtual rearrangement of the various products within the plurality of vertical display levels within the virtual display area of the store, including a second graphical indicator of the product at the second physical location within the virtual display area;

generating, via the one or more servers, a predicted change in the predicted performance value based on the created model in response to the product being relocated within the virtual display area;

displaying within the graphical user interface the predicted change in product performance resulting from the rearrangement of the product to the second physical location within the virtual display area.

20. The method of claim 1, further comprising virtually arranging the product within the virtual display area on the graphical user interface using a drag-and-drop command, wherein the product is dragged and dropped to create various product placement scenarios to be simulated.

* * * * *